United States Patent [19]

Henderson

[11] Patent Number: 4,615,916
[45] Date of Patent: Oct. 7, 1986

[54] SURFACE TREATMENT OF GLASS CONTAINERS

[75] Inventor: Henry N. Henderson, Lacoochee, Fla.

[73] Assignee: Owens-Illinois, Inc., Toledo, Ohio

[21] Appl. No.: 624,558

[22] Filed: Jun. 25, 1984

[51] Int. Cl.$^4$ ............................................. C23C 16/00
[52] U.S. Cl. ..................... 427/255; 65/60.5; 65/60.51; 65/60.52; 427/255.3; 427/255.5; 427/345
[58] Field of Search ................ 427/255, 255.3, 255.2, 427/255.5, 345; 65/60.5, 60.51, 60.52

[56] References Cited

U.S. PATENT DOCUMENTS

| | | | |
|---|---|---|---|
| 3,353,514 | 11/1967 | Lyle | 427/255 |
| 3,438,803 | 4/1969 | Dubble et al. | 427/255 |
| 3,498,819 | 3/1970 | Lyle et al. | 427/255 |
| 3,516,811 | 6/1970 | Gatchet et al. | 427/255 |
| 3,561,940 | 2/1971 | Scholes | 427/255 |
| 3,623,854 | 11/1971 | Frank | 427/255 |
| 3,658,304 | 4/1972 | Hall et al. | 427/255 |
| 3,827,870 | 8/1974 | Fogelberg et al. | 427/255 |
| 3,850,679 | 11/1974 | Supko et al. | 427/255.3 |
| 3,876,410 | 4/1975 | Scholes | 427/255 |
| 3,952,118 | 4/1976 | Novice | 427/255 |

Primary Examiner—Sadie L. Childs
Attorney, Agent, or Firm—John R. Nelson

[57] ABSTRACT

A method for treating hot glass containers that are moved through a treatment zone. The treatment zone is a system which utilizes heated compressed air aspirators rather than electric motor driven blowers to cause a treatment vapor laden air contained in chambers to be propelled across the width of the ware conveyor from both sides at adjacent, horizontally spaced, points in the conveyor length. The resultant streams of heated air and vapor laden air will impinge on the containers carried on the conveyor and are of a size to cover the container height to about the shoulder. The vapor and air that passes the containers from one direction is captured and fed to the chamber for feeding in the other direction. Thus the vapor laden air is recirculated from side to side with additional concentrated treatment vapors introduced to maintain a certain level of tin or titanium in the vapors so as to produce the metal oxide coating on the containers. In addition, streams of air propelled by heated compressed air aspirators rather than motor driven blowers sweep across the finish portion of the container immediately above the vapor laden streams to effectively keep the metal oxide coating from forming on the threads or finish of the container.

5 Claims, 3 Drawing Figures

SURFACE TREATMENT OF GLASS CONTAINERS

BACKGROUND OF THE INVENTION

In the application of surface treatments to bottles and jars, where it is desired to coat the containers while they are hot from the forming of the glass, it is customary to use organic metallic compounds, such as stannic chloride and stannous fluoride in vapor form. Titanium compounds, such as titanium tetrachloride or tetra-isopropyl titanate, likewise have been found to be particularly useful in producing a titanium dioxide coating on the glass bottles. The oxide coating is very thin, usually in the range of 40–120 microns in thickness.

Methods and apparatus used to generate and propel the vapors into contact with the hot bottles to be treated have been the subject of several patents, such as U.S. Pat. No. 3,323,889 to Carl and Stiegleman and U.S. Pat. No. 3,561,940 to Scholes.

These apparati generally consist of a hood positioned over the machine conveyor for transporting the ware in single file from the forming machine. The treatment vapors are fed to the hood, which typically is in two sections facing each other on opposite sides of the conveyor. The tin or titanium vapors are propelled from each side to contact the two sides of the moving ware. In order to conserve the metallic compounds, it is customary to recirculate the vapor from one side of the hood to the other, adding new vapor only as it becomes depleted.

As indicated above, the hoods are fundamentally designed to propel the heated metal halide vapors across the conveyor carrying the hot container to be treated. In order to prevent the hydrolysis of the vapors on the bottles, it has been found necessary that the vapors be heated to a temperature above the dew point for the particular treatment material. Thus, provision is made to heat the vapor itself prior to its being conveyed or blown across the conveyor. This typically is done either by a heated source of compressed air in which the vapors become entrained or by heating the vapor after its production and prior to its being conveyed in contact with the side wall of the container. Obviously, moving the container into a position in front of a moving stream of heated metallic halide vapors would only effectively treat that surface which is in the line-of-sight of the vapor generator and, while it could be possible to rotate the container and thus provide 360° or total circumferential coating of the container, it has been found more economical and easier to provide two streams of vapor issuing from opposite sides of a moving conveyor to impinge the two sides of the container as they move in a straight line therebetween. The two vapor streams are generated at either sides of the conveyor, one upstream and the other somewhat downstream relative to the conveyor movement.

There are successful and widely used treating hoods which are provided with a system to prevent the impingement, to a great extent, of treatment vapor onto the finish of the containers being treated. This prevention of treatment on the finish has several beneficial results. Perhaps the most significant benefit is that it provides a container whose threaded finish will not be coated with a tin or titanium oxide coating. It has been found that threaded, metal halide coated necks of containers with closures applied frequently are difficult to remove by twisting of the closure from the threaded container.

Another problem that has been experienced is that with the use of tin as the surface treatment, there is a possibility that once a closure is applied, the tin treated surface and the closure may react, causing a rusting to occur. When the closure is applied to a full container, stored, and then later removed, the unsightly rust that may have formed makes the product less than appetizing to the consumer.

One of the most successful and most widely used types of treating apparatus is that designed by the American Glass Research and sold as the AGR-GCMI MARK II $SnCL_4$ hot end applicator. This hood is provided with two pairs of blowers with one blower being used to propel the hot vapors across the conveyor and a second blower positioned vertically above the first to propel a stream of warm air across the finish portion of the container. Both the air stream and the lower, surface treating vapor producing flow are captured at the opposite side of the conveyor. In the case of the lower vapor flow, this is electrically heated and recirculated through a similar blower at the opposite side of the conveyor and directed back across the conveyor to treat the opposite surface of the container. Likewise, the air from the upper blower, which provides the air barrier across the finish of the container, is captured and vented through an exhaust system. A similar blower and air barrier is provided above the opposing vapor treating system. Thus, it can be seen that this particular arrangement provides an apparatus which has four blowers associated with each complete treatment hood. In addition to the blowers, each half of the hood is provided with electric heater elements in the recirculating duct and a thermostat for controlling the current to the elements. One problem experienced with these hoods has been the cleaning of the hoods and the maintenance of the hoods to prevent the burning-out of the blowers and the heater elements and the resultant loss of effective treatment during periods when the hoods are not efficiently operating or operating without the ware being treated.

When the AGR hood is in operation without all of the blowers working properly or without both heaters operating, the ware is not treated adequately nor is the unit operating with any degree of efficiency.

SUMMARY OF THE INVENTION

The present invention is directed to the the process by which vapors are impinged on moving glass containers by the use of heated compressed air as the motive means, both for the treatment vapor directed across the path of movement of the ware, and the air barrier to prevent the impingement of treatment vapor on the finish of the container. The heated compressed air is also the means of heating the treatment vapor and the air barrier. It is an object of this invention to provide a method of treating glass containers, which method does not require the use of electrically driven blowers or heater elements in the environment of the treatment hood. This system of the invention is both economical and more readily suited to a long-term campaign without the total failures of the prior art when blowers would clog or burn out, or the electric heating elements would burn out.

DETAILED DESCRIPTION OF THE DRAWINGS

Figure 1:
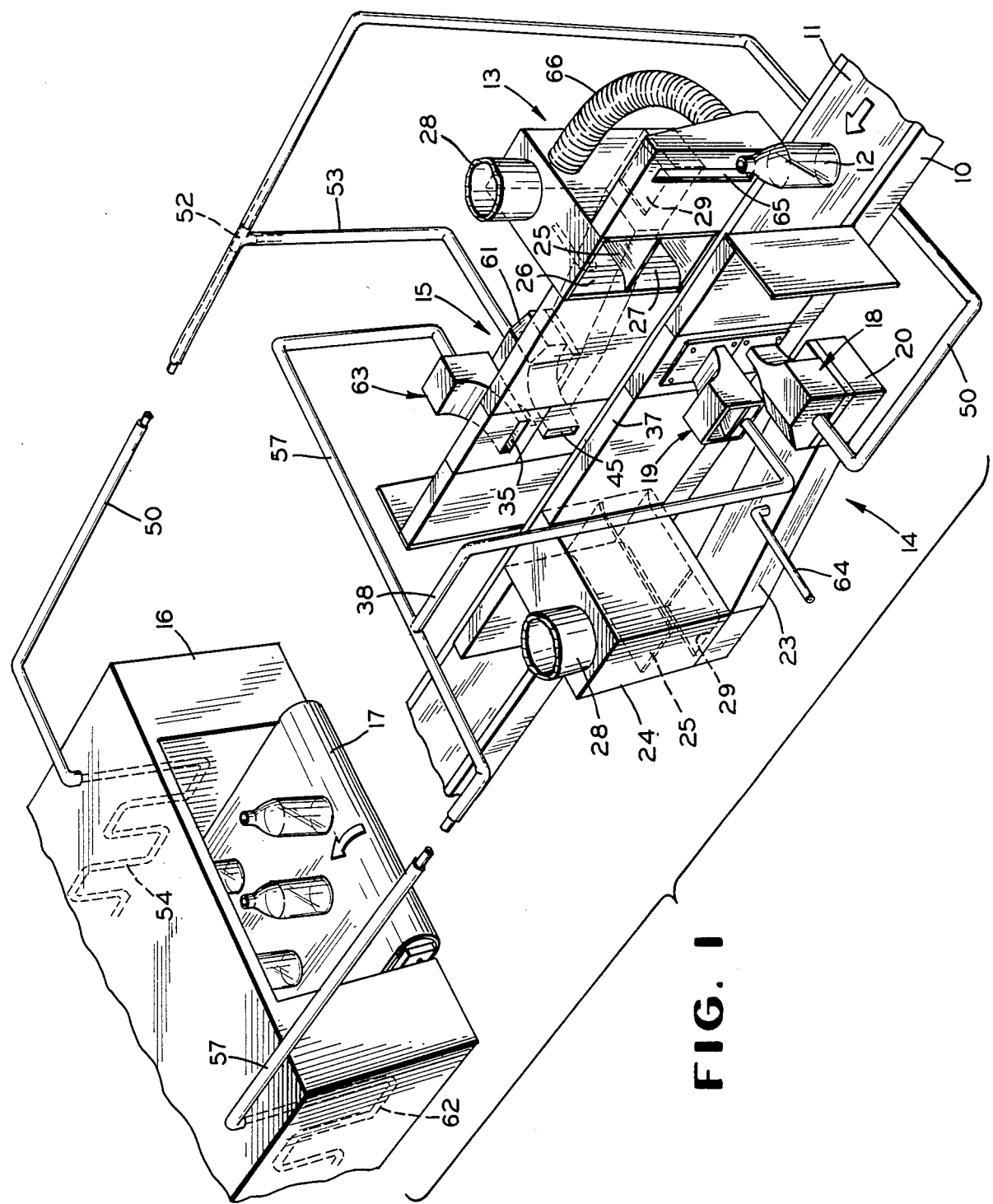
FIG. 1 is a perspective view of the overall apparatus used in the invention.

With particular reference to FIG. 1, the general appearance and operation of the invention will be described. In the manufacture of glass containers, it is the practice at present to provide the containers, while they are still hot from the forming operation, with a tin or titanium oxide treatment. This treatment is effected by moving the containers through a treatment area or zone where a treatment gas, such as titanium tetrachloride or tin chloride in vapor form, is directed at the container from two sides. The vapor impinges on the container and then leaves on the container a thin metallic oxide coating in the thickness range of 40-110 microns.

A conveyor 10 having a moving surface 11 moving in the direction of the arrows shown thereon will carry newly formed glass containers 12. The containers 12 are still hot from the forming operation and are moved in single file in the conveyor surface 11 through a treatment hood generally designated 13. The treatment hood 13 specifically comprises two opposed units 14 and 15 positioned on opposite sides of the conveyor 10. The units 14 and 15 are essentially identical being, in effect, merely turned through 180° with respect to each other such that the unit 14 will apply a treatment gas to the left side of the bottle as it moves between the units and the unit 15 will, in effect, provide treatment gas to the opposite side of the container 12. After the treatment has been affected, the bottles will move to a lear 16 where the bottle are positioned in rows on the moving lear mat 17 to carry the bottles through the lear 16 and to anneal the containers. The lear 16, as is well known in the art, is provided with a heated interior through the use of gas burners stretegically placed along the length of the lear. Each of the application positions of the units 15 and 16 is divided into a lower treatment gas unit generally designated 18 and an upper air barrier forming unit 19. The lower unit 18 at the left side is positioned atop a vertical piece of duct work 29 and is in communication with the interior of this duct work through a generally circular opening 21 formed through the bottom of the lower unit 18. The circular opening 21 has a baffle 21A horizontally positoned toward the front of the unit 18. The vertical duct work 20 is connected to and communicates with a horizontal, generally rectangular shaped, piece of duct work 23. The duct 23 as shown in FIG. 1 extends beneath a generally boxlike enclosure 24 and communicates through an opening 29 into the interior of the enclosure 24.

The boxlike enclosure 24 is divided by a baffle 25 into upper and lower chambers 26 and 27, respectively. The upper chamber is formed with an opening in its roof which communicates with an exhaust duct 28. While the baffle 25 is shown in dotted line on the left hand unit or enclosure 24, it may be seen particlly in full line when viewing the unit 15, at the right hand side of the conveyor, in FIG. 1. Both chambers 26 and 27 are open in the direction of the conveyor as it clearly seen when viewing the right hand unit 15. As previously explained, the horizontal duct 23 opens through an opening 29 into the bottom of the lower chamber 27.

Figure 2:
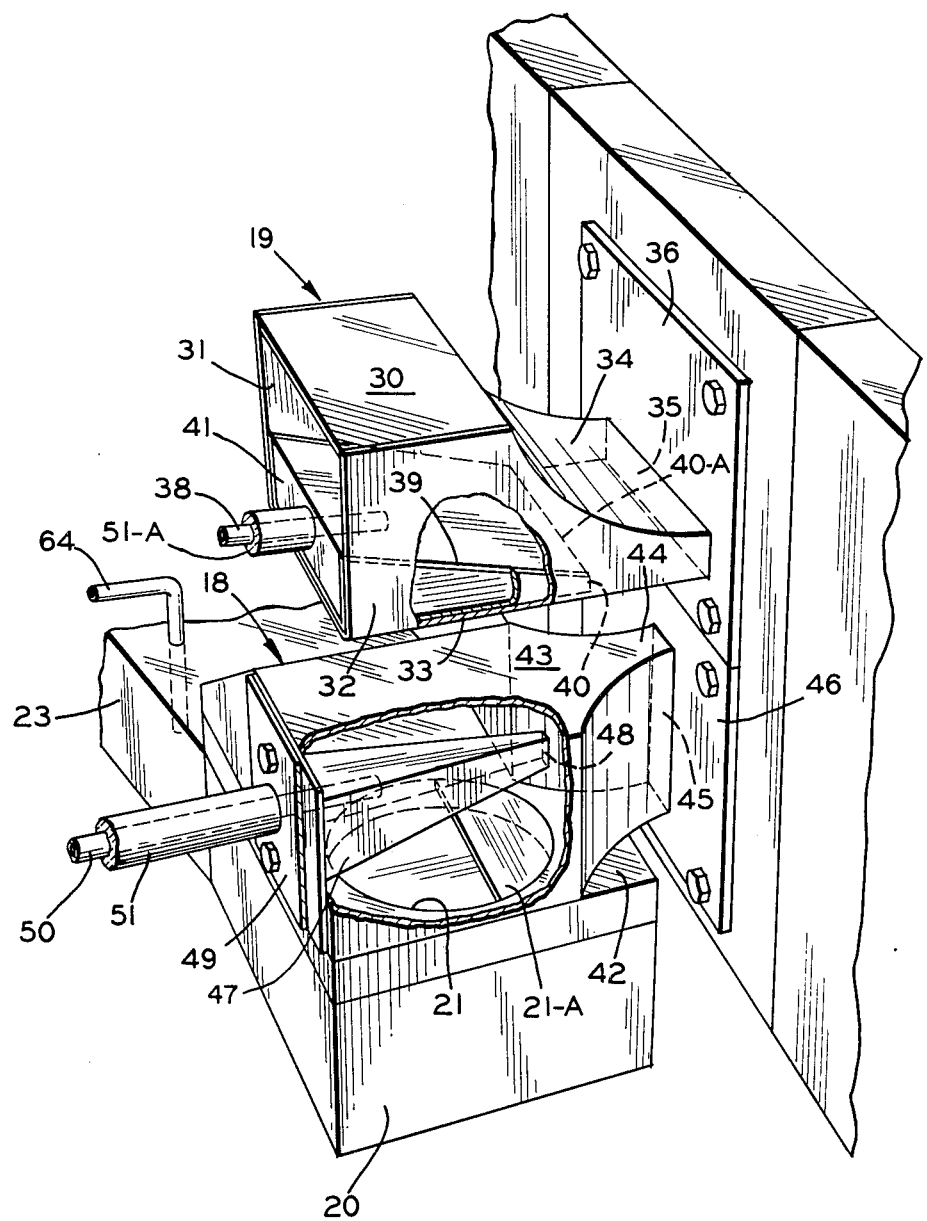
FIG. 2 is an enlarged perspective view of one area of the apparatus of FIG. 1 illustrating the metal halide propelling and air barrier portion of the invention.

The upper unit 19 forms an air barrier unit. The unit 19, as shown in detail in FIG. 2, is formed with an upper generally flat top 30, sidewalls 31 and 32 and a bottom wall 33. The top 30 at its forward edge is joined to a downwardly and outwardly sloping, nozzle forming, upper wall 34 which, with the sidewalls 31 and 32 and the bottom 33, form a rectangular flow directing nozzle 35. The nozzle 35 is fixed in a comparably sized opening formed in a mounting plate 36. The mounting plate 36 mounts to the side of a vertical support wall 37 which extends parallel to the direction of movement of the conveyor and extends the length of the hood 13. It should be pointed out that there is a wall 37 similar to and on the opposite side of the conveyor from the wall 37. Both walls have been given the same reference numeral 37 as have many of the parts making up the facing hood units 14 and 15, since they are essentially identical.

The air barrier unit 19, when positioned as shown in FIG. 1, will direct a curtain of heated air across the gap between the two walls of the units over and past the finish of the container passing therebetween. The flow of air will be directed into the upper chamber 26 in the enclosure 24. This air is then exhausted upward through the stack 28 which may be under some negative pressure. The heated compressed air which is propelled across the finish of the ware enters the upper unit 19 through a feed pipe 38. The pipe 38 is provided with thermal insulation 51A thereby to maintain the air in the pipe at an elevated temperature. Within the interior of the upper unit 19 is positioned a generally planar wall 39 which spans the width of the upper unit and exrends generally downwardly toward the floor of the unit in the direction of the forward end of the unit. The wall 39 is tne top of a wedge shaped member that rests on the bottom 33 of the unit 19 and constitutes a nozzle 40, with an opening 40A 1/16 inch high and ¼ inch wide. As best shown in FIG. 2, the pipe 38 extends through a back wall 41 of the upper unit 19. Heated compressed air in the pipe 38 within the nozzle 40 will inspirate and heat a flow of clean air through the opening 35 in the front of the unit and the opening in the mounting plate 36. This flow of heated clean air sweeps across and is directed toward the upper chamber 26, as previously described. The ambient air which the nozzle 40 inspirates and heats can enter the upper chamber 19 through the back thereof which is open above the back wall 41 and wall 39.

The lower unit 18 is formed with a generally rectangular bottom plate 42 through which the previously mentioned circular opening 21 containing baffle 21A extends. Above this opening is formed an enclosure 43 which is generally rectangular in shape at its left hand side as viewed in FIG. 2. At its forward or right hand end it is shaped to form a venturi or a pair of vertical converging walls which form a relatively small rectangular exit opening 45 to the right. The opening 45 is positioned in a complementary opening of the same size in a vertical mounting plate 46 which is of substantially the same size as the mounting plate 36 for the upper unit 19. The mounting plate 46 is attached to and overlies an opening in the side 37 of the treatment hood. Within the enclosure 43 and in horizontal and vertical alignment with the center of the opening 45 there is provided a nozzle 47. The nozzle 47 is generally rectangular in cross section and, as shown in FIG. 2, presents a nozzle opening 48 of a size of approximately 1/16 inch wide and ¼ inch high. The nozzle 47 is mounted to a vertical mounting plate 49 which in turn is bolted to the interior of the chamber or enclosure 43 at the back wall thereof. A pipe 50 extends through the plate 49 and into the interior of the nozzle 47. The pipe 50 is provided with thermal insulation 51 thereabout to maintain the air in the pipe at an elevated temperature.

As schematically shown in FIG. 1, the pipe 50 extends to a T 52 which connects to a pipe 53 that extends to the unit 15. The pipe 50 enters the heated area within the lear 16 and, as schematically shown in FIG. 1, becomes a serpentine section 54 which, in effect, becomes a heat exchanger.

Figure 3:
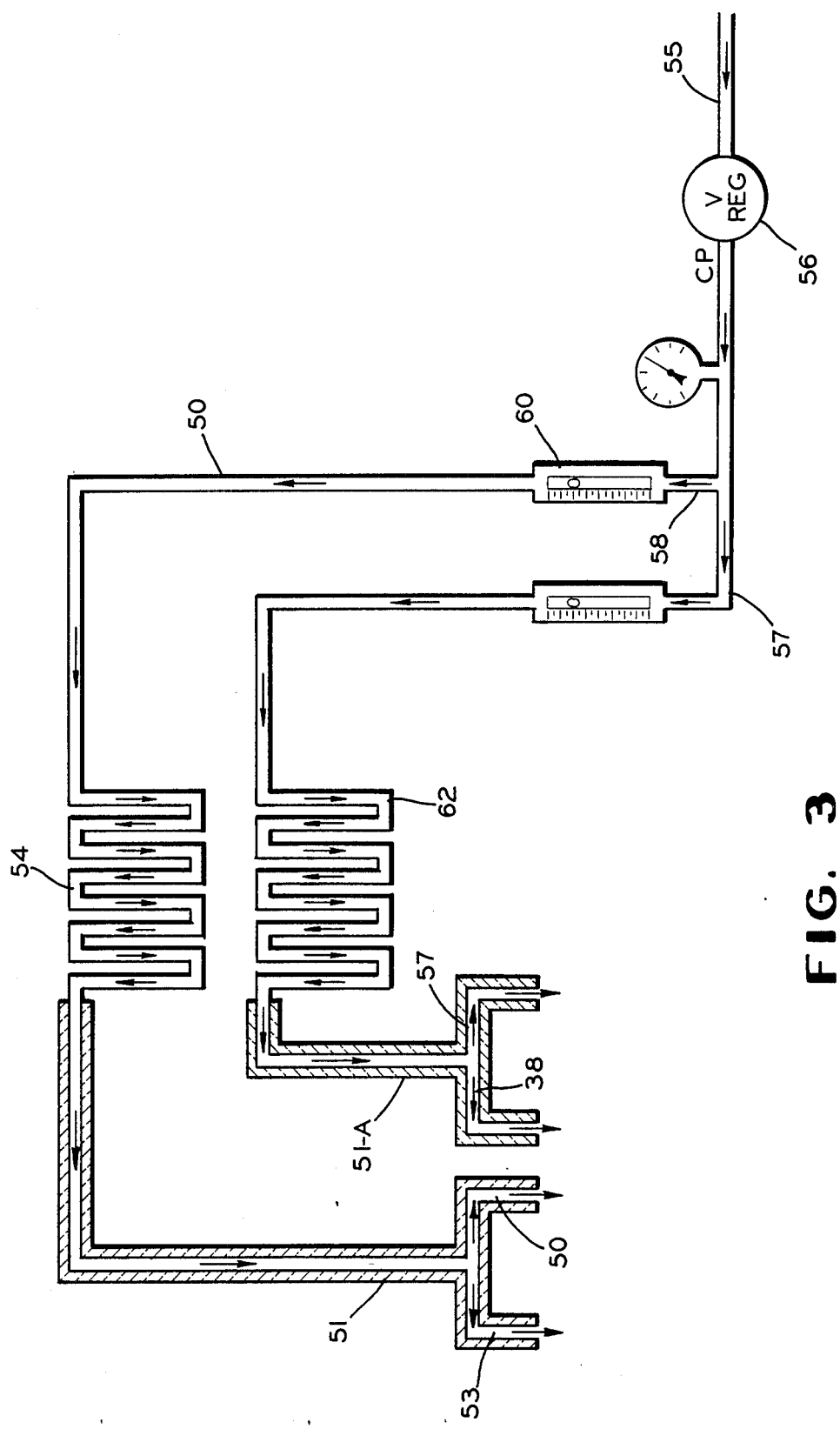
FIG. 3 is a schematic flow diagram showing the air supply to the system.

As schematically illustrated in FIG. 3, a source of dry air is supplied through an inlet pipe 55. The air is supplied from a 100 psi source of dry air and passes through a pressure regulator 56. The air is then split into two lines 57 and 58 with each line having a flow meter 60 therein. The line 58 connects to line 50 as it exits the flow meter and the air under pressure in the line 50 passes through tne serpentine section 54 to increase the heat of the air up to 300°-800° F., thence the air flows to the two pipes 50 and 53, respectively, to the units 14 and 15. In the case of the pipe 50, it is connected to the lower unit 18 and in the case of the pipe 53, it is connected to a lower unit 61 of the hood unit 15. Similarly, the air from the pipe 57 flows through a serpentine path 62 where the air is heated. The heated air then passes to the upper unit 19 of the hood unit 14 through the pipe 38. The pipe 57 also connects to an upper unit 63 of the hood unit 15. It should be pointed out that both the units 18 and 61 are identical, as also are the units 63 and 9. Thus, it can be seen that heated dry air is provided to both the hood units 14 and 15 to propel and heat the surface treatment gas onto the ware passing through the hood 13 as well as preventing the treatment from reaching the finish of the ware. The treatment vapor, such as the tin or titanium, is introduced into the horizontal duct work 23 by a pipe 64 extending from a vapor generator (not shown). It should be understood that there is a supply pipe (not shown), such as 64, which will introduce treatment vapor to the hood unit 15 in a horizontal duct that extends from beneath the opening 29 in the lower chamber 27 to beneath the lower unit 61.

In addition to the prevention of treatment vapor from impinging on the finish of the container, the treatment is generally prevented from passing beyond the ends of the treatment hood 13 by the fact that a vertical opening 65 in the vertical wall 37 adjacent the end, only one of which is shown in FIG. 1, is connected through a flexible hose 66 to the upper exhaust chamber 26 and thence to the exhaust duct 28. In this way a sort of air curtain is provided across the inlet and exit ends of the hood 13 to help prevent the movement of the treatment vapor out from the ends of the hood.

With the foregoing apparatus in operation, it can be seen that the treatment gas which is introduced through the pipe 64 will enter the unit 18 and be propelled and heated by the heated air in the pipe 50 across the path of the containers on conveyor 11. The vapors from the lower unit 18, which are not intercepted by containers, enter the lower chamber 27 and fall through the opening 29 and pass into a duct similar to 23 on the opposite side where any additional vapor may be added, and this vapor then becomes the treatment vapor for the unit 61. In this way, the vapor is propelled and heated by the hot air from pipe 53 and will exit through the nozzle 45 and sweep across the conveyor. Both nozzles 40 and 47, shown in FIG. 2, are designed to serve two purposes. First, they are to drive the aspirators 18 and 19, secondly, they are to heat, preheat, or help to maintain the temperature of the recirculated treatment vapor. As already noted, the hotter the aspirator air and the treatment vapor, the more efficient the system will function.

In prior units, such as the AGR hood previously mentioned, the ambient air being drawn into the units by the blower to provide the air barrier was always at a lower temperature than the recirculated heated treatment vapor. The clean air flow would therefore remove heat from the system as it was exhausted and the loss of heat would make the system less efficient. In the present invention, the nozzle 40 acts as both an air heater and nozzle. The ambient air is warmed or preheated as it passes over the flat top surface 39 of the nozzle 40. The entire nozzle is heated by the hot compressed air from pipe 38. The preheated, clean air flow is inspirated through the nozzle 35 and it is heated even more by the jet of hot compressed air from the nozzle opening 40A. The hotter the clean air flow is maintained, the less heat is taken from the treatment vapor flow.

In units 18 and 61, the baffle 21A works in conjunction with nozzle 47 to heat, preheat or help maintain the temperature of the heated recirculated treatment vapor. The baffle 21A causes the heated recirculated treatment vapor to enter the opening 21, towards the rear of the units 18 and 61, at an accelerated rate of flow and momentarily swirl or pass around the heater/nozzle 47. Thus, preheating or helping to maintain the temperature of the heated recirculated treatment vapor as it is inspirated through nozzle 45 by the hot compressed air being propelled out opening 48 of nozzle 47. The heated compressed air from pipe 50 heats heater/nozzle 47. The heated compressed air from nozzle opening 48 mixes with and heats or increases the temperature of the already heated or preheated treatment vapor as it contacts the sidewall of the ware passing through the hood.

Without the baffle 21A mounted to the front of opening 21 in the vapor units, the recirculated treatment vapor tends to be inspirated, or drawn up, through opening 21 towards the front of the unit contacting very little of the heater/nozzle 49, thus not using the available heat to help maintain higher temperature levels for the treatment vapor. The bottles will be treated on the right side and the excess vapor will pass into the lower portion of the enclosure 24 through the opening 29 and into the duct work 23. Thus, there is a recirculation taking place for all of the vapor laden air. The air coming from the upper units 19 and 63 which form the air barriers is exhausted through the exhaust stacks or ducts 28. In addition, air at either end of the hood unit 13 is exhausted through the openings 65 and the flexible hoses 66 connecting these openings in the chambers behind them to the exhaust ducts 28.

By having the heated vapor recirculated, there is a more economical usage of the tin or titanium. In addition, with the system of the invention, there is less likelihood of a failure in the hood operation. There are no electrically driven blowers or heater elements which can become inoperative, usually due to a lack of adequate maintenance. Furthermore, the hood units of the invention are easier and simpler to construct and easier to keep them relatively airtight since it is not necessary to have the several cleanout doors that were found in the units with blower. The tighter the hood, the more efficient the system will be and the less chance for intrusion of cool air into the vapor system.

It should also be apparent from the foregoing description that even by using a fairly small volume of aspirator air a very large amount of air and vapor will be inspirated from the hood and through the recirculating duct and back into the hood without diluting the vapors very much. By restricting the flow of the aspirator air with the smaller nozzle openings, the volume of air induced into the hood at a given time is reduced by increasing the velocity of the hot aspirating air.

It should also be kept in mind that the hotter the aspirator air and the recirculated, inspirated air is maintained, the better the tin adheres to the glassware and the less buildup of residue in the units. With the system as disclosed herein, the upper unit should never require cleaning under normal use. The lower unit may operate for as long as four weeks, if air temperatures are maintained, before cleaning is necessary. It has been found that there may be a buildup of residue over an extended period of use which would cause stoppage of the blower type units but not cause any noticeable decrease in the efficiency of the unit of the invention. The nozzles used to propel the vapor laden air can be easily removed from the units and the vapor directing nozzle into which the inspirator nozzle extends can be cleaned easily with a brush and air without major disassembly. The air barrier flow and the treatment vapor flow velocities are controlled by flow meters 60.

Other advantages will be apparent from the foregoing description and modifications may be resorted to without departing from the spirit and scope of the attached claims.

What is claimed:

1. The method of forming a metal oxide coating on the exterior of glass containers having a body portion and upper, finish portion while moving in succession on a conveyor through a treatment zone, comprising the steps of creating a first generally horizontal flow path of compressed air directed across the width of the conveyor in one direction, said flow being narrow in width and height dimension, surrounding said first flow path with a first tapering chamber having a narrowing outlet, said first chamber being of a larger size than the first flow path, introducing a metal halide treatment vapor into the tapering chamber and propelling the vapor across the width of the conveyor with the directed flow of heated compressed air, collecting the vapor containing air flow on the opposite side, creating a second horizontal flow path of compressed air across the conveyor at a second position, surrounding said second flow path with a second tapering chamber, having a narrowing outlet, said second chamber being larger than the second flow path, introducing the vapor containing air collected from said first flow path into the second tapering chamber and propelling the vapor in said second chamber by said second flow path, collecting the vapor containing flow from said second flow path and introducing it to the inlet to the first tapering chamber with the addition of treatment vapor whereby the vapor and air are circulated and recirculated across the width of the conveyor to treat the body portion of containers passing through the vapor and creating a flow of compressed air across the upper finish portion of the containers, in parallel to the first and second flow paths to prevent treatment reaching the finish.

2. In the method of forming a metal oxide coating on the body portion of newly formed glass containers moving upright in succession on a conveyor prior to their passage into an annealing lehr, wherein a metallic halide in vapor form is propelled from chambers across the conveyor width in two streams from both sides of the conveyor at adjacent, horizontally spaced points in the conveyor length, said streams having a height comparable to the height of the side wall and shoulder area of the container and wherein the treatment vapor is continuously circulated from one stream to the other across the conveyor in a closed loop and with an air barrier also being provided across the finish of the containers just above the moving streams of the metallic halide vapor, the improvement comprising propelling the metallic halide vapor by the injection of heated compressed air into the vapor in the chambers to create the flow of metallic halide vapor across the conveyor and injecting heated compressed air in the direction of the finish of the containers to create a flow of heated air as a barrier across the finish of the containers being coated.

3. The method of claim 2 further comprising heating the compressed air to a temperature of 300°-800° F. before injecting it into the chambers containing the metallic halide vapor and before creating the air barrier flow.

4. The method of claim 3 wherein said compressed air is heated to 350°-500° F. at the point of injection into the vapor and the creation of the air streams.

5. The method of claim 3 wherein the heating of the compressed air is done by passing the air through a heat exchanger positioned in the annealing lehr prior to introduction to the treatment chambers.

* * * * *